(12) United States Patent
Jager

(10) Patent No.: US 7,642,792 B2
(45) Date of Patent: Jan. 5, 2010

(54) PROBE CARD FOR TESTS ON PHOTOSENSITIVE CHIPS AND CORRESPONDING ILLUMINATION DEVICE

(75) Inventor: Axel Jager, Pontcharra (FR)

(73) Assignee: STMicroelectronics S.A., Montrouge (FR)

( * ) Notice: Subject to any disclaimer, the term of this patent is extended or adjusted under 35 U.S.C. 154(b) by 263 days.

(21) Appl. No.: 11/607,839

(22) Filed: Dec. 1, 2006

(65) Prior Publication Data

US 2007/0132467 A1 Jun. 14, 2007

(30) Foreign Application Priority Data

Dec. 5, 2005 (FR) .................................. 05 12316

(51) Int. Cl.
*G01R 31/02* (2006.01)
(52) U.S. Cl. ..................................... 324/754
(58) Field of Classification Search ........................ None
See application file for complete search history.

(56) References Cited

U.S. PATENT DOCUMENTS

| | | | |
|---|---|---|---|
| 6,515,358 B1 * | 2/2003 | Dass et al. | 324/754 |
| 6,667,631 B2 * | 12/2003 | Ivanov | 324/762 |
| 6,686,993 B1 | 2/2004 | Karpman et al. | |
| 7,427,768 B2 * | 9/2008 | Kim et al. | 324/754 |
| 2008/0218186 A1 * | 9/2008 | Kooiman et al. | 324/754 |

FOREIGN PATENT DOCUMENTS

EP 1 111 668 A2 6/2001

OTHER PUBLICATIONS

Patent Abstracts of Japan, vol. 1999, No. 11, Sep. 30, 1999; & JP 11 153620, Matsushita Electric Ind., Co., Ltd., Jun. 8, 1999.
Patent Abstracts of Japan, vol. 011, No. 209 (E-521) Jul. 7, 1987; & JP 62 031136 A, Matsushita Electric Inc., Co., Ltd., Feb. 10, 1987.
Patent Abstracts of Japan, vol. 2000, No. 16, May 8, 2001; & JP 2001 007166 A, Seiko Epson Corp, Jan. 12, 2001.
Preliminary French Search Report, FR 05 12316, dated Sep. 20, 2006.
French Written Opinion, FA 673586 (FR 05 12316), dated Dec. 12, 2005.

* cited by examiner

*Primary Examiner*—Jermele M Hollington
(74) *Attorney, Agent, or Firm*—Gardere Wynne Sewell LLP

(57) ABSTRACT

A probe card and its corresponding illumination device are provided for performing electrical operating tests, preferably done in parallel, with respect to a plurality of chips provided with connection pads, under illumination conditions given by a lighting source, the probe card being a printed circuit board (PCB) including electrical connections to the chip on its lower face, the probe card also including electrical connections to the lighting.

17 Claims, 4 Drawing Sheets

PROBE CARD FOR TESTS ON PHOTOSENSITIVE CHIPS AND CORRESPONDING ILLUMINATION DEVICE

PRIORITY CLAIM

The present application claims priority from French Patent Application No. 05 12316 filed Dec. 5, 2005, the disclosure of which is hereby incorporated by reference.

BACKGROUND OF THE INVENTION

1. Technical Field of the Invention

The invention relates to the domain of manufacturing of electronic chips and particularly the operating tests phase.

More precisely, the invention relates to the manufacturing stage during which chips are created on wafers, usually silicon wafers that are circular lamellas cut from a semiconducting material on which up to several thousand chips are manufactured simultaneously and are subsequently separated.

2. Description of Related Art

The chips are integrated in more and more products in daily life (general public) and for professional purposes. The development of optical products such as webcams, portable photo cell phones or 3G phones, optical mice, etc., requires integration of photosensitive chips in these electronic devices.

The invention is specifically applicable to manufacturing of these photosensitive chips.

Before each chip can be integrated into a corresponding package, its operation has to be tested both electrically and optically, in other words its electrical operation under given illumination conditions.

Electrical and optical test devices for chips are known in prior art.

Such test devices are described in more detail later on (see, FIGS. 1A and 1B), and conventionally include a prober coupled to a probe card (needle card) on which a wafer is mounted containing the chip(s) to be tested. There is another block above this block corresponding to a test head. The needle card is a printed circuit board (PCB). It is used to test operation of the chips by contact between the electrical connection means (the needles) and determined pads on the chips to be tested.

For test devices concerning photosensitive chips, the needle card is perforated to allow light to pass through the card, either directly through the holes or along guides, for example optical fibers.

The light test checks the electronic behavior of photosensitive chips under the influence of a chosen light, representative of the operational usage conditions of the finished product containing the chip(s) in question. For use under realistic conditions, the test is used to detect chip response defects, and therefore to make a selection and chips that do not satisfy determined quality criteria are eliminated.

The tests are done chip by chip in series, or in parallel, depending on the number of chips on the wafer, and their complexity (number of pads per chip). In terms of productivity, it is desirable to perform the tests in parallel.

Production of light and checking of illumination conditions are essential. The test must be capable of varying these illumination conditions, for example by the number of lux per unit area, the wavelength, the lighting frequency, the signal/noise ratio, etc. The order of magnitude of specifications for a given chip type can then vary up to several hundred.

Furthermore, there is a computer test program and an expected behavior model of the chip. The real behavior should be compared with the expected behavior and the tested chip may or may not be retained for the remainder of manufacturing, depending on differences in behavior and given quality criteria.

Known solutions use light sources on the input side of the probe card, either inside or outside the test head, that illuminate the wafer with a particularly complex opto-mechanical system. Furthermore, in order to carry out tests in parallel, the illuminators must obtain good light quality uniformity over a large area, which is particularly difficult to achieve.

In order to enable tests of photosensitive chips, a conventional illuminator has a complex structure including particularly an external energy source, an illumination controller, a closer, color filters, opto-mechanical attenuators, lenses and a light source.

This configuration creates a number of problems including that a test device, due to its complexity, is dedicated to a given type of chip test, which reduces the flexibility of the production line.

Furthermore, due to the complexity and the manner in which light is brought to the outside surface of the wafer through an optical fiber or a particular arrangement of lenses, a large quantity of light energy is necessary at the source. Such energies are usually produced by halogen lamps that have a limited life and for which optical properties are neither uniform nor stable in time. Furthermore, if the light source is outside the test head, the size inherent to such a source is also a problem.

It is difficult to obtain uniform light distribution at the wafers for tests in parallel, which requires increased complexity in the arrangement of lenses and requires even higher power at the source.

If a light source is placed outside the test head (halogen source), such a configuration makes it impossible to use strobe light, however this is necessary for changing light conditions during the test, for example for tests related to integrated chips in optical mice.

Finally, since probe cards are perforated, wiring in these probe cards is relatively complex because the optical path must be free, therefore there must be no optical or electrical cable located on this optical path.

Thus, having seen the complexity of test devices and specific features of illumination conditions, testers are dedicated to a specific type of chip. This causes problems in production lines, if only due to the time necessary to change the means useful for production for a given illumination condition.

The purpose of this invention is to overcome these disadvantages by proposing a probe card for electrical operating tests of at least one chip provided with connection pads under illumination conditions given by a lighting means, said probe card being a printed circuit board (PCB) including electrical connection means to said chip on its lower face.

SUMMARY OF THE INVENTION

To achieve this, the needle card according to the invention, that complies with the generic definition given in the above preamble in other respects, is characterized essentially in that it also includes the lighting means.

With this configuration, the light source may be integrated as close as possible to the wafer holding the chips to be tested, the light source possibly being located above or adjacent to each chip under test.

The light source on the needle card according to the invention receives its energy and control signals (switching on and switching off) on the test head directly through the probe card.

Preferably, the lighting means comprises a plurality of unit light sources, for example light emitting diodes (LEDs) covering any part of the light spectrum including the infrared and ultraviolet, laser diodes, etc.

Advantageously, unit light sources are arranged in matrices or in matrix arrays.

In one embodiment, the unit sources are fixed and wired individually to the probe card.

In a variant embodiment, these unit sources are fixed and wired to a "daughter" card, this daughter card being fixed and wired to the needle card. Such a configuration enables easy replacement of one or more unit sources.

With the configuration according to the invention, a single unit light source or a sum of unit light sources may be used selectively for each tested chip.

The lighting means is physically connected to the needle card, either removably so that it can be replaced, or non-removably.

In a first configuration, the printed circuit board includes at least one hole, the lighting means being located in this hole, or on the side of the top face of the needle card.

In a second configuration, the printed circuit board is solid, the lighting means being located on the side of the lower face of the needle card.

In one embodiment, the needle card also includes means of controlling the lighting means. These control means may be integrated into the above mentioned daughter card. Preferably, they are configured to selectively control each unit light source.

In the preferred embodiment, the electrical connection means and the illumination means are configured to test operation of a plurality of chips in parallel.

In one embodiment, the needle card also comprises a photodetector, for example located among the unit sources and preferably on the lower face of the needle card.

With this configuration, the light source may easily be checked by reflection on the wafer.

Thus, all illumination switching signals and return signals may be checked directly by the tester.

With the proposed arrangement, a light adjustment by chip is possible and is particularly advantageous during tests in parallel.

In one embodiment, the optical path passes through filters and/or diffusers connected to the lighting means or the needle card.

Due to the proposed arrangement, the needle card may be of any type, vertical or cantilevered.

The invention also relates to an operating test device for an electronic chip under illumination conditions given by a lighting means, including at least one wafer on which there is a plurality of electronic chips, and on which there is at least one needle card with lighting means as described above.

In this device, the lighting means control signal is sent to said lighting means through the needle card.

In one embodiment, the device also includes automatic disconnection means configured to automatically interrupt the control signal for illumination of the lighting means.

Due to this arrangement, the needle card is electrically disconnected as soon as the test head is lifted from the device interface board, protecting the operator from dangerous UV or laser radiation. The (dis)connection is done using Pogo pins that retract when the operator lifts the test head.

Preferably, the light source consists of a plurality of unit sources, each unit source being individually controllable.

Advantageously, light emitted by the illumination means is pulsed light.

With the device according to the invention, the illumination controller according to prior art is actually eliminated, and light distribution on the tested chips is particularly uniform.

BRIEF DESCRIPTION OF THE DRAWINGS

Other special features and advantages of this invention will become clearer after reading the following description given as an illustrative and non-limitative example and given with reference to the appended figures, wherein.

DETAILED DESCRIPTION OF THE DRAWINGS

Figure 1A:
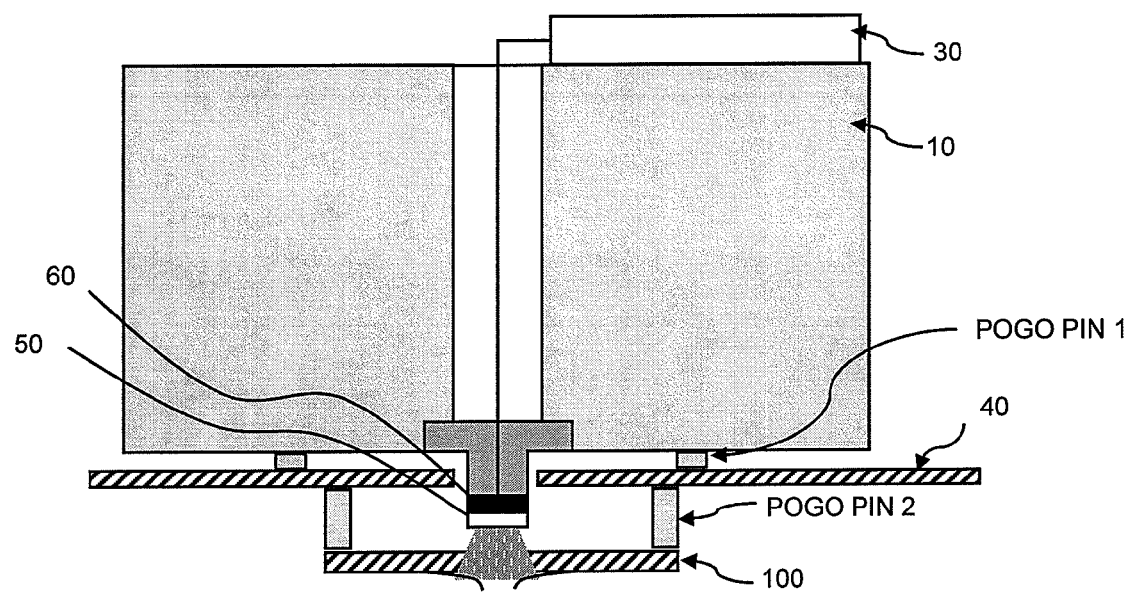
FIGS. 1A-1B shows a diagrammatic view of a test device according to prior art.
Figure 1A:
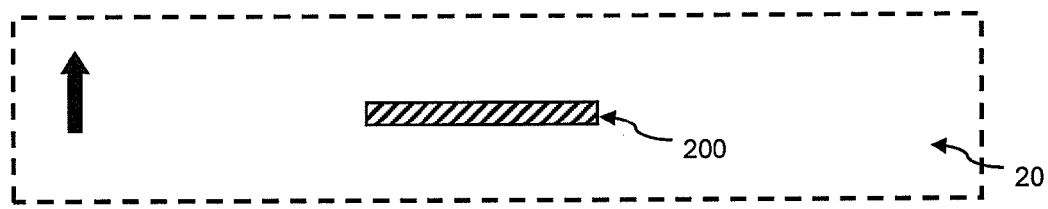
Figure 1B:
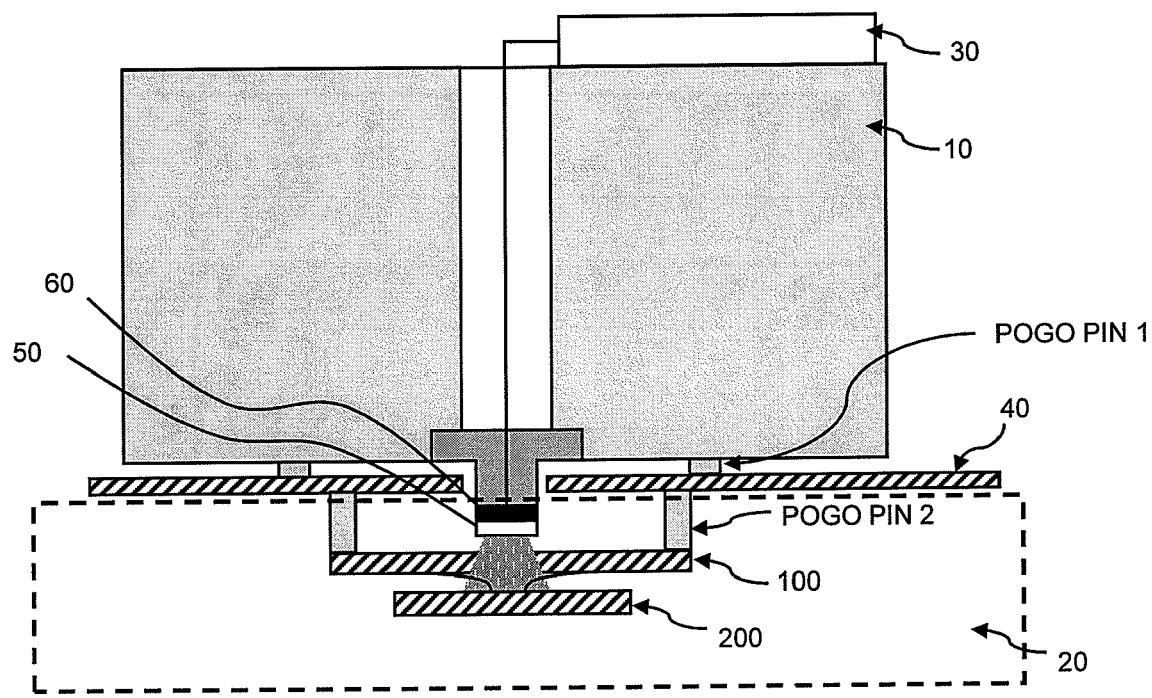

As shown in FIGS. 1A and 1B, a conventional device for testing the operation of electronic chips includes several elements and particularly:

a prober 20 that is a standalone device capable of receiving a cassette (not shown) with a given number of wafers (typically 25) as shown in FIG. 1A, transporting each wafer to an individual support (not shown) and aligning the wafer 200 with respect to a needle card 100 as shown in FIG. 1B, a tester (not shown) configured to execute a computer test program corresponding to the chip to be tested, in other words the final electronic device comprising the chip to be tested, and that includes a test head 10. This test head 10 is physically and electrically attached to the prober 20 through a Device Interface Board (DIB) 40. The DIB 40 makes electrical connection to the test head 10 through a first set of Pogo pins. The DIB 40 is further physically and electrically attached to the prober 20 containing the wafer 200 to be tested in a removable manner, and a needle card 100 is loaded in the prober 20 to be easily removable. The needle card makes electrical contact with the device interface board 40 through a second set of Pogo pins. Electrical contact is made to the wafer 200 when the individual support comprising the wafer 200 lifts (see arrow) until the wafer is in contact with the needles on the needle card 100.

In order to start an electrical test, a cassette containing wafers 200 is loaded into the prober, and a needle card corresponding to the product to be tested is loaded in the test device.

A computer configuration program corresponding to the product to be tested is loaded, said program enabling the prober to align the wafer with respect to the needle card. The test is run by an operator using a remote interface, for example a touch screen.

The prober then displaces the individual support on a horizontal plane (along two orthogonal axes x and y) so that the needles on the needle card are located immediately above the contact pads of the first chip to be tested, and then lifts the individual support to make contact.

The needle card is loaded removably into the prober and the test head is connected to this card through the device interface board.

Once in contact, the prober sends a signal to the tester so that the tester runs the test program. As soon as the test is finished, the tester sends a signal to the prober so that it can displace the individual support to the next chip (for tests in series).

The two devices communicate with each other, for example through a GPIB type cable or an RS232 link.

In the case of an optical test, an illumination sequence has to be added during execution of the electrical test program. The test device then includes an illuminator to which the tester sends a control signal to switch the light on or off, possibly several times for each tested chip.

In one embodiment according to prior art shown in FIGS. 1A and 1B, an illuminator controlled by a controller 30 includes a lighting means 60, for example light emitting diodes (LEDs) that diffuse light to the wafer through a diffuser 50. The illuminator is mounted to the test head 10. An opening is provided in the device interface board 40 through which the structure of the illuminator extends. An opening is also provided in the needle card 100 through which the emitted light from the illuminator passes so as to illuminate the wafer 200.

Figure 2:
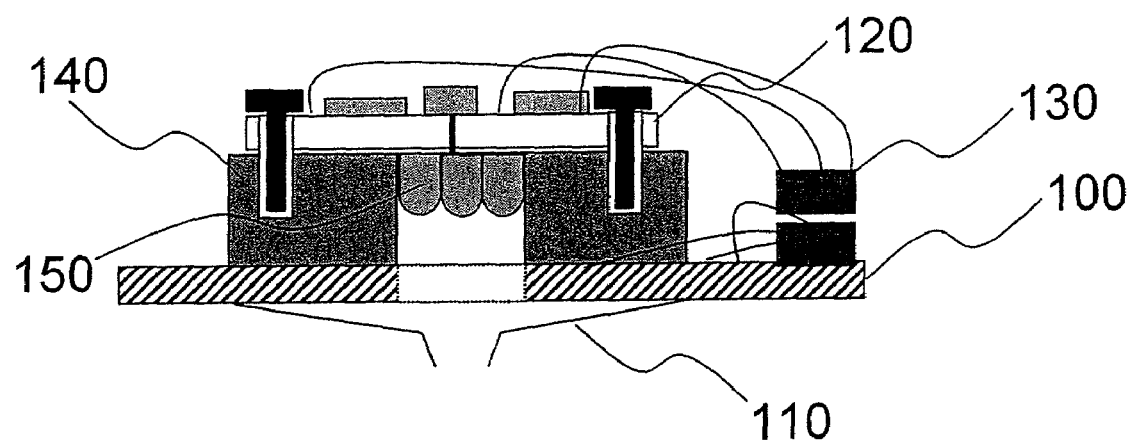
FIG. 2 shows a diagrammatic view of an embodiment of a probe card according to the invention.
Figure 3:
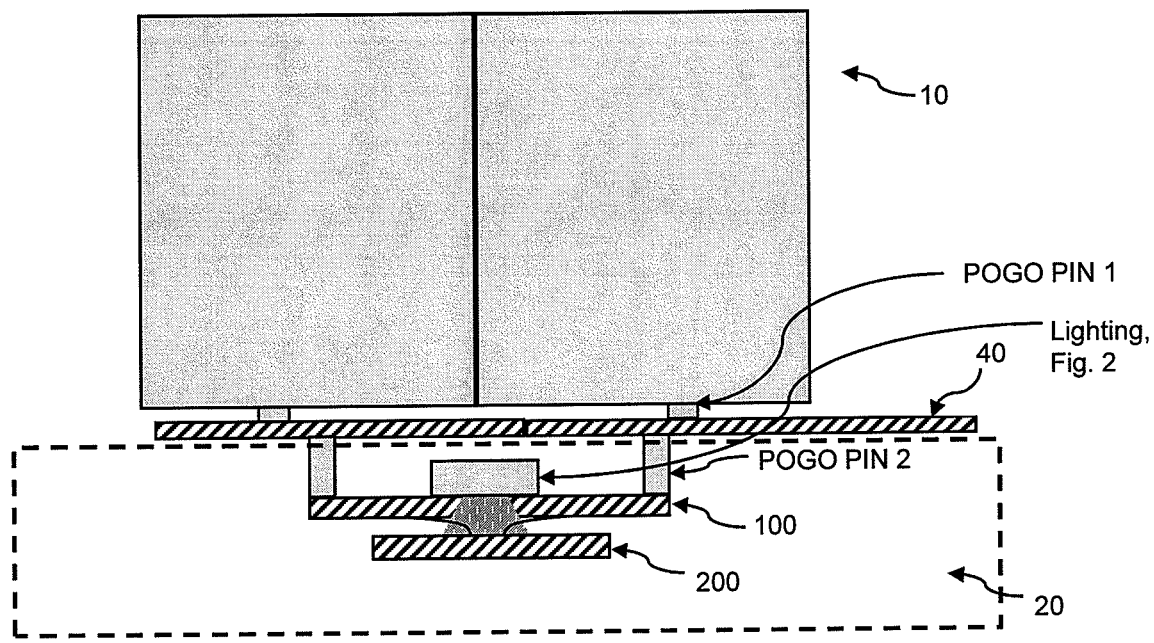
FIG. 3 shows a diagrammatic view of the probe card of FIG. 2 installed in a test device.

With reference now to FIGS. 2 and 3, in a test device according to the invention, a wafer 200 comprising a plurality of chips to be tested, preferably in parallel, is positioned between the prober 20 and the test head 10. The needle card 100 is located above the wafer. This needle card 100 includes lighting means preferably composed of a plurality of LEDs. Since the lighting means is physically and electrically connected to the needle card, the control signal of the lighting means is sent to the lighting means through the test head and the needle card, which simplifies the electrical wiring diagram particularly by eliminating the illumination controller and test head configuration according to the prior art FIGS. 1A and 1B.

With this configuration, when an operator lifts the test head, for example to replace a LED or to replace a needle card, the electrical link between the test head and the needle card is broken, the illumination control signal of the lighting means is therefore automatically broken which makes it possible to secure the test device, particularly when using UV or laser light that is dangerous for the operator.

According to the invention in FIG. 2, the lighting means is coupled to the needle card 100 to form a probe card. Preferably, the lighting means includes unit LED type light sources and is physically and electrically connected to the needle card 100. It receives control signals from the test head through the device interface board 40 (through the Pogo pins) and connections 130 located on the needle card 100.

Therefore, the LEDs are physically connected to the needle card 100 and are also electrically connected to it. Advantageously, a removable assembly facilitates a repair when necessary. As a variant, the lighting means may be fully and removably integrated into the needle card 100.

In a first configuration, the needle card 100 is perforated. Also in a first embodiment, the lighting means is located adjacent to the top face of the needle card 100. As shown in FIG. 2, the needle card 100 then includes needles 110, a connector 130 to electrically connect the needle card to the lighting means 150 in this example composed of LEDs; and optionally, a stiffener 140, for example a metallic stiffener, is positioned between the needle card 100 and the daughter card 120, for structurally stiffening the board.

In this particular embodiment, the needle card also includes a control device for the light source 120, for example in the form of a printed circuit such as located on a daughter card 120.

In this particular embodiment, the needle card 100 is provided with means of carrying light towards the lower face of the card, for example through holes in the card or wave guides such as optical fibers.

In a second embodiment, the lighting means is integrated into the needle card 100, for example if the card includes a ceramic substrate, by insertion into it for example by inserting LEDs into the holes in the needle card. This embodiment means that wave guides such as optical fibers are not necessary to carry light towards the lower face of the needle card 100, because at least part of the LEDs are on the surface on the side of the lower face of the needle card.

In a second configuration, the needle card 100 is not perforated. Thus in a third embodiment, the lighting means is directly located on the side of the lower face of the needle card, consequently some components of the needle card may be of the illuminating type so as to illuminate the chip to be tested. For example, the lighting means may be composed of LEDs soldered onto the lower face of the card.

Regardless of the embodiment, the unit light sources (LEDs) are advantageously arranged as a matrix or in array(s) of matrices.

Some products to be tested require the use of diffuse light. According to the invention, it is then possible to use a diffuser installed on the card between the lighting means and the chip, and preferably on the lower face of the card. As a variant, the lighting means, for example the LED, may have an integrated diffuser.

Due to the proximity between the lighting means and the test wafer, the distance between this diffuser and the chip may be practically zero.

Advantageously, the control signal of the lighting means can be used to test chips under pulsed light (stroboscopic).

The invention claimed is:

1. Apparatus for testing at least one chip provided with connection pads, under illumination conditions, comprising:
    a test head without means for illuminating the at least one chip, the test head outputting a lighting control signal;
    a needle card printed circuit board (PCB) including needles for making electrical connection to said chip connection pads, said needle card PCB comprising a front surface and a back surface and having an opening extending from the back surface to the front surface, the needle card receiving the lighting control signal from the test head,
    a daughter card printed circuit board (PCB) including a lighting means, wherein the lighting means is mounted to and electrically connected to the daughter card PCB, and
    wherein the daughter card PCB is mounted to and electrically connected to the back surface of the needle card PCB to receive the lighting control signal from the needle card PCB, the lighting means illuminating said chip through the opening in the needle PCB.

2. Apparatus set forth in claim 1, in which the daughter card PCB also comprises circuitry for controlling the lighting means in response to the lighting control signal.

3. Apparatus as in claim 1, in which the lighting means includes a plurality of unit light sources.

4. Apparatus as in claim 1, in which the unit light sources are arranged in a matrix or in network of matrices.

5. Apparatus set forth in claim 3, in which the circuitry for controlling the lighting means selectively control each unit light source.

6. Apparatus as in claim 1, in which the needles and the lighting means test operation of a plurality of chips, in parallel.

7. A testing device, comprising:
    a needle card comprising a printed circuit board including a front surface having needles to make connection to an integrated circuit chip under test and further including a back surface, the needle card receiving an illumination control signal from a test head; and a daughter card mounted through a structural stiffener which stiffens the needle card to the back surface of the needle card printed circuit board, the daughter card being in electrical connection with the needle card to receive the illumination control signal, the daughter card including a lighting source for supplying light to illuminate the integrated circuit chip under test in response to the illumination control signal.

8. The device of claim 7 wherein the needle card printed circuit board includes an aperture, the lighting source of the daughter card illuminating the integrated circuit chip under test through the aperture in the needle card printed circuit board.

9. The device of claim 8 wherein the lighting source is positioned in the aperture.

10. The device of claim 8 wherein the lighting source is positioned above the aperture.

11. The device of claim 7 wherein the daughter card is a replaceable component with respect to the testing device, the device further comprising connection plug means to electrically connect the daughter card to the needle card printed circuit board.

12. The device of claim 7 wherein the structural stiffener includes an aperture, the lighting source of the daughter card arranged to illuminate the integrated circuit chip under test through the aperture in the structural stiffener.

13. The device of claim 12 wherein the needle card printed circuit board includes an aperture, the lighting source of the daughter card arranged to illuminate the integrated circuit chip under test through the apertures in both the needle card printed circuit board and the structural stiffener.

14. The device of claim 7 further including attachment pins to attach the daughter board to the structural stiffener.

15. A needle card for use in an integrated circuit testing apparatus, comprising:

a first printed circuit board (PCB) of the needle card having a bottom probe surface supporting a plurality of needles for making electrical contact with an integrated circuit under test in the testing apparatus, and further having a top surface including electrical connection means for making electrical connection to the testing apparatus, and still further having an opening formed through the first PCB, the first printed circuit board receiving an illumination control signal from a test head; and a lighting source mounted to the top surface of the first PCB and receiving the illumination control signal from the first PCB, the lighting source supplying light in response to the illumination control signal to illuminate the integrated circuit chip under test through the opening in the first PCB.

16. The needle card of claim 15 further comprising a second printed circuit board (PCB) to which the lighting source is attached, the second PCB being mounted through attachment means to the top surface of the first PCB.

17. The needle card of claim 16 further comprising electrical connection means for electrically connecting the second PCB to the first PCB.

* * * * *